United States Patent
Ushioda et al.

(10) Patent No.: US 12,378,695 B2
(45) Date of Patent: Aug. 5, 2025

(54) METHOD FOR HEAT-TREATING SILICON WAFER

(71) Applicant: GLOBALWAFERS JAPAN CO., LTD., Niigata (JP)

(72) Inventors: Aya Ushioda, Niigata (JP); Tatsuhiko Aoki, Niigata (JP)

(73) Assignee: GLOBALWAFERS JAPAN CO., LTD., Niigata (JP)

( * ) Notice: Subject to any disclaimer, the term of this patent is extended or adjusted under 35 U.S.C. 154(b) by 776 days.

(21) Appl. No.: 17/283,158

(22) PCT Filed: Oct. 10, 2019

(86) PCT No.: PCT/JP2019/039983
§ 371 (c)(1),
(2) Date: Apr. 6, 2021

(87) PCT Pub. No.: WO2020/080247
PCT Pub. Date: Apr. 23, 2020

(65) Prior Publication Data
US 2021/0348302 A1    Nov. 11, 2021

(30) Foreign Application Priority Data
Oct. 15, 2018  (JP) .............. JP2018-194053

(51) Int. Cl.
*C30B 29/06*   (2006.01)
*C30B 33/02*   (2006.01)
(Continued)

(52) U.S. Cl.
CPC .............. *C30B 33/02* (2013.01); *C30B 29/06* (2013.01); *H01L 21/322* (2013.01); *H01L 21/324* (2013.01)

(58) Field of Classification Search
CPC ....... C30B 29/06; C30B 33/02; H01L 21/322; H01L 21/324; H01L 21/67115; H01L 21/67248
See application file for complete search history.

(56) References Cited

U.S. PATENT DOCUMENTS 5,788,763 A * 8/1998 Hayashi ................ C30B 15/206
257/E21.321
6,630,991 B2 * 10/2003 Kitamura .............. G01J 5/0003
219/494

(Continued)

FOREIGN PATENT DOCUMENTS

CN    101048858 A    10/2007
CN    102473614 A    5/2012

(Continued)

OTHER PUBLICATIONS

European Patent Office, English computer translation of JP 2011-014645 (Year: 2023).*

(Continued)

*Primary Examiner* — Matthew J Song
(74) *Attorney, Agent, or Firm* — BUCHANAN INGERSOLL & ROONEY PC

(57) ABSTRACT

Provided is a method for heat-treating a silicon wafer in an inert gas atmosphere, wherein it is possible to discharge SiO gas produced in melting a natural oxide film on the surface of the silicon wafer efficiently, to suppress the accumulation of reaction products in the heat treatment chamber, and to prevent slip deterioration. The wafer is held for a period of 5 to 30 sec inclusive, the rotational speed of the wafer is set to 80 to 120 rpm, and further the inert gas supply in the chamber is controlled so that the gas replacement rate is 90% or more in a temperature range of 900 to 1100° C. inclusive.

4 Claims, 3 Drawing Sheets

(51) Int. Cl.
*H01L 21/322* (2006.01)
*H01L 21/324* (2006.01)

(56) References Cited

U.S. PATENT DOCUMENTS

| | | | |
|---|---|---|---|
| 2002/0020696 A1 | 2/2002 | Kitamura et al. | |
| 2003/0134492 A1 | 7/2003 | Lerch et al. | |
| 2004/0231759 A1 | 11/2004 | Kobayashi et al. | |
| 2007/0252239 A1* | 11/2007 | Maeda | H01L 21/3225 257/E21.321 |
| 2008/0000551 A1* | 1/2008 | Sato | H01L 21/0234 700/121 |
| 2010/0009548 A1* | 1/2010 | Nakamura | H01L 21/324 257/E21.328 |
| 2010/0038757 A1 | 2/2010 | Isogai et al. | |
| 2012/0184091 A1 | 7/2012 | Senda et al. | |
| 2012/0319191 A1* | 12/2012 | Lorenti | H01L 29/66712 257/329 |

FOREIGN PATENT DOCUMENTS

| | | | | |
|---|---|---|---|---|
| DE | 10119047 A1 | | 11/2001 | |
| DE | 10024710 A1 | | 12/2001 | |
| JP | 2002507250 A | | 3/2002 | |
| JP | 2005203575 A | | 7/2005 | |
| JP | 2008053521 A | | 3/2008 | |
| JP | 2011014645 A | * | 1/2011 | ........... H01L 21/324 |
| JP | 2011029429 A | | 2/2011 | |
| JP | 2011233556 A | | 11/2011 | |
| JP | 2012231050 A | | 11/2012 | |
| KR | 10-2010-0127682 | * | 12/2010 | ........... H01L 21/322 |
| TW | 200818329 A | | 4/2008 | |
| WO | 03003441 A1 | | 1/2003 | |

OTHER PUBLICATIONS

European Patent Office, English computer translation of KR10-2010-0127682 (Year: 2024).*
Office Action issued on Nov. 25, 2021, by the German Patent and Trademark Office in corresponding German Patent Application No. 11 2019 005 151.2 and an English translation of the Action. (11 pages).
International Search Report (PCT/ISA/210) with an English translation, and Written Opinion (PCT/ISA/237) mailed on Dec. 17, 2019, by the Japan Patent Office as the International Searching Authority for International Application No. PCT/JP2019/039983. (9 pages).
Chinese Office Action issued on Aug. 9, 2023 in corresponding Chinese Patent Application No. 201980068159.8.

* cited by examiner

METHOD FOR HEAT-TREATING SILICON WAFER

TECHNICAL FIELD

The present invention relates to a method for heat-treating a silicon wafer, which is particularly capable of discharging SiO gas produced effectively when a natural oxide film is melt on the surface of the silicon wafer and suppressing the accumulation of SiO solid in a heat treatment chamber under the heat treatment in an inert gas atmosphere.

BACKGROUND ART

There has been a demand for improvement in the quality of semiconductor substrates such as silicon wafers (hereinafter simply referred to as "wafers") along with high integration of semiconductor devices. It is especially essential to reduce crystal defects in an active region where the device is formed. For example, as for a silicon wafer produced from growing single-crystal silicon and other various processes, crystal defects generated in the course of single-crystal growth remain in the processed wafer.

A method using an RTP (Rapid Thermal Process) device as described in PTL 1, for instance, is known as the method of reducing crystal defects contained in the silicon wafer by short-time heat treatment. The method of PTL 1 includes heating a silicon wafer at a temperature ranging from 1300° C. to silicon melting point and cooling it down to a temperature ranging from 400 to 800° C. in an argon gas atmosphere. And after the atmosphere switched over to oxygen, the silicon wafer is heat-treated within a range of 1250° C. to silicon melting point in the RTP device.

However, the heat treatment in an argon gas atmosphere causes a natural oxide film formed on the wafer surface to melt and desorb as SiO gas. As the generated SiO gas is not completely discharged and gas-etches the silicon surface at high temperature, $SiO_x$ solid thereof accumulates on the inner wall of the chamber and the surfaces of the other parts with low temperature. And the $SiO_x$ solid causes a problem that particles adhere to the wafer in the process of heat treatment.

In general, while a single wafer heat treatment device is used, the treatment temperature of the silicon wafer is controlled by measuring temperatures at plural points of the backside of the wafer with a non-contact radiation thermometer and so forth. But in case reaction products such as $SiO_x$ described above accumulate on the radiation thermometer, the temperatures cannot be accurately measured. Consequently, the temperatures on the wafer become uneven during the treatment, thereby generating the slip defects.

Regarding the problem with reaction products due to SiO gas, PTL 2 discloses a method of generating atmospheric current in a space between a silicon wafer and a radiation thermometer to decrease the accumulation rate of reaction products on the radiation thermometer.

PTL 3 discloses that rotating wafers at a high speed to a certain degree (e.g., 250 to 350 rpm) can suppress the generation of slip defects, because reaction products do not accumulate on the wafer.

CITATION LIST

Patent Literature

PTL 1: Japanese Unexamined Patent Application Publication No. 2011-29429

PTL 2: Japanese Translation of PCT International Application Publication No. 2002-507250

PTL 3: Japanese Unexamined Patent Application Publication No. 2011-233556

SUMMARY OF INVENTION

Technical Problem

However, even if the method described in PTL 2 enables the amount of reaction products accumulating on the radiation thermometer to reduce, the accumulation itself cannot be completely inhibited.

Though the method described in PTL 3 is effective for suppressing the accumulation of reaction products on the wafer, SiO gas generated through removal of a natural oxide film is difficult to be discharged from the chamber, so that there arises another problem that reaction products such as SiO accumulate in the chamber after continuous treatment.

Under such circumstances, as a result of intensive studies, the present inventors have come to find out the followings. When the heat treatment is carried out in an inert gas atmosphere while rotating the silicon wafer, the efficiency of discharging SiO gas from the heat treatment chamber is improved by controlling the rotational speed of the wafer and the gas replacement rate in a temperature range (i.e., 900 to 1100° C.) in which SiO gas is generated from the wafer surface by the time the temperature reaches 1300° C. or more. Thereby the accumulation of reaction products such as SiO inside the chamber can be prevented.

An object of the present invention is to provide a method for heat-treating a silicon wafer, which is capable of effectively discharging SiO gas produced in melting a natural oxide film on the surface of the silicon wafer, suppressing the accumulation of reaction products in the heat treatment chamber, and preventing slip deterioration during the heat treatment in an inert gas atmosphere to reduce crystal defects contained in silicon wafers in a short time.

Solution to Problem

The method for heat-treating a silicon wafer according to the present invention to solve the above issue, is a method where the silicon wafer installed rotatably in a chamber is subjected to rapid thermal process of heating and cooling in an inert gas atmosphere. In the method, the wafer is held for a period of 5 sec or more, the rotational speed of the wafer is set to 80 to 120 rpm inclusive, and the inert gas supply in the chamber is controlled so that the gas replacement rate can be 90% or more in a temperature range of 900 to 1100° C. inclusive in the chamber.

By the time the heat treatment temperature in the chamber reaches 1300° C. or more, it is preferable that the wafer is held for 5 to 30 sec inclusive and the rotational speed of the wafer is preferably 80 to 120 rpm inclusive in a temperature range of 900 to 1100° C. inclusive.

The chamber pressure is preferably 1 kPa or less in a temperature range of 900 to 1100° C. inclusive.

In case a silicon wafer is heat-treated in an inert gas atmosphere using such a heat treatment method, SiO gas produced when a natural oxide film melts on the surface of the silicon wafer can be effectively discharged by controlling the rotational speed of the wafer and the gas replacement rate in the chamber. As a result, reaction products hardly accumulate inside the heat treatment chamber, which leads to prevention of slip deterioration.

Advantageous Effects of Invention

The present invention provides the method for heat-treating a silicon wafer, which is capable of effectively discharging SiO gas produced when a natural oxide film on the surface of the silicon wafer melts, suppressing the accumulation of reaction products in the heat treatment chamber, and preventing slip deterioration under the heat treatment of the silicon wafer in an inert gas atmosphere.

DESCRIPTION OF EMBODIMENTS

Figure 1:
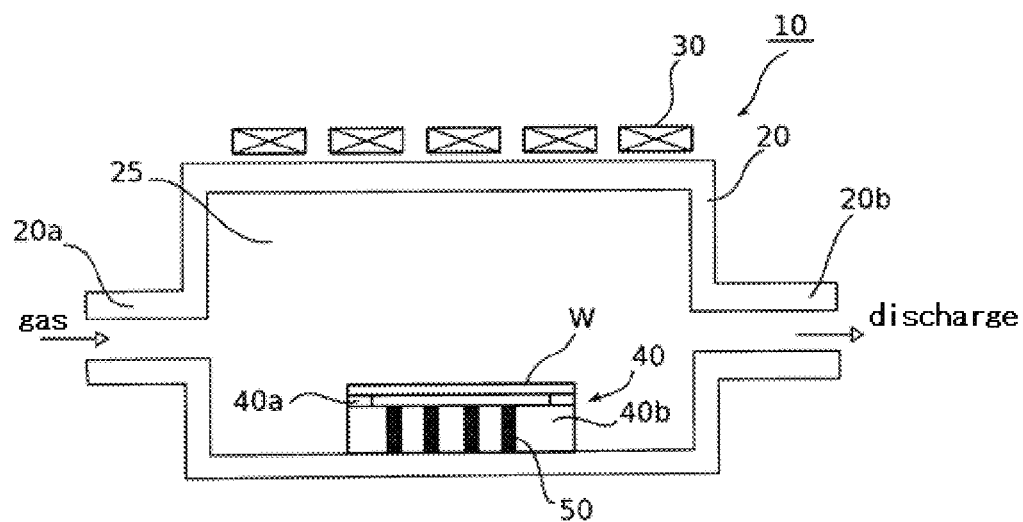
FIG. 1 is a cross section showing the RTP device used in the method for heat-treating the silicon wafer according to the present invention.

Hereinafter, a preferable embodiment of the present invention will be described while referring to the drawings.

FIG. 1 is a cross section showing an example of the RTP device used in the method for heat-treating the silicon wafer of the present invention.

As shown in FIG. 1, the RTP device 10 used in the method for heat-treating the silicon wafer of the present invention has a chamber (reaction tube) 20 equipped with an atmospheric gas inlet 20a and an atmospheric gas outlet 20b. Plural lamps 30 are spaced above the chamber 20 and a wafer supporting section 40 is placed to support a wafer W in a reaction space 25 of the chamber 20. The RTP device 10 includes a rotation tool (not illustrated) which rotates the wafer W around the central axis at a predetermined speed.

The wafer supporting section 40 has a susceptor ring 40a for supporting the periphery of the wafer W and a stage 40b for supporting the susceptor 40a. The chamber 20 is made of quartz, for instance. The lamp 30 is a halogen lamp, for instance. The susceptor 40a is made of silicon, for instance. The stage 40b is made of quartz, for instance.

In case of being subjected to the RTP with the RTP device 10 shown in FIG. 1, the wafer W is inserted into the reaction space 25 through a wafer inlet (not illustrated) in the chamber 20 and then is mounted on the susceptor 40a constituting the wafer supporting section 40. An atmospheric gas described below is introduced from the atmospheric gas inlet 20a, and the lamp 30 irradiates the surface of the wafer W while rotating the wafer W with the rotation tool (not illustrated).

The temperature of the reaction space 25 in the RTP device 10 is controlled by measuring an average temperature of many points, e.g., nine points on a wafer plane of the lower part of the wafer W in the diameter direction using plural radiation thermometers 50 implanted into a stage 40b of the wafer supporting section 40. And based on the obtained average temperature, plural halogen lamps 30, to be specific, an ON/OFF switch of each lamp and the light intensity of an emitting light are controlled.

Next, the method for heat-treating the silicon wafer of the present invention is explained referring to the drawings.

The method for heat-treating the silicon wafer of the present invention is making use of the RTP under a predetermined manufacturing condition using silicon wafers sliced from an ingot of single-crystal silicon grown by the Czochralski method.

The ingot of Czochralski single-crystal silicon is grown with a known method.

To be specific, a polycrystalline silicon filling a quartz crucible is heated to produce silicon melt. And a seed crystal is brought into contact with a liquid surface of the silicon melt and then lifted with the seed crystal and the quartz crucible rotating. An ingot of single-crystal silicon is manufactured by growing the seed crystal until its straight body part is enlarged to a desired diameter.

The ingot of single-crystal silicon thus obtained is processed into silicon wafers with a known method.

To be more concrete, the ingot of single-crystal silicon is sliced in the shape of wafers with an inner periphery cutter, a wire saw and so on, and then the silicon wafer is manufactured after going through the processes of chamfering of its outer periphery part, lapping, etching, and grinding. It should be noted that the process herein described is just an example and the present invention is not limited thereto.

Next, the silicon wafer obtained is subjected to the RTP under a predetermined manufacturing condition.

Figure 2:
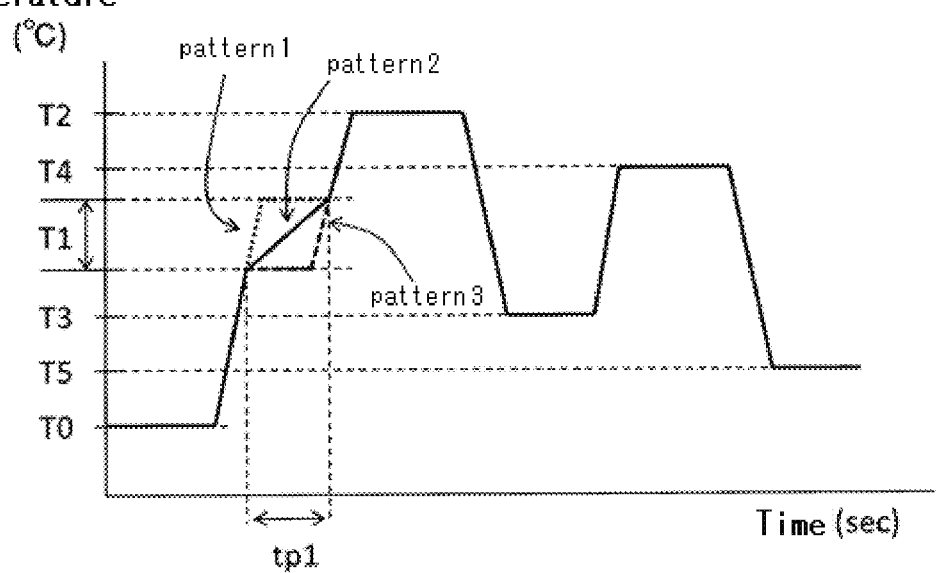
FIG. 2 is a graph showing the sequence of the method for heat-treating the silicon wafer according to the present invention.

FIG. 2 is a schematic chart showing the heat treatment sequence in the RTP for use in the method for heat-treating the silicon wafer of the present invention.

The heat treatment sequence in the RTP for use in the method for heat-treating the silicon wafer of the present invention is the following. The silicon wafer manufactured as described above is placed in the chamber 20 kept at a requested temperature of T0, e.g., 500° C., in the RTP device 10 as shown in FIG. 1.

An atmospheric gas such as argon gas is introduced from the atmospheric gas inlet 20a, making the chamber the inert gas atmosphere.

The chamber 20 is heated by the halogen lamp 30. The chamber 20 is rapidly heated at a predetermined heating rate until it reaches a temperature range T1 of 900 to 1100° C. inclusive as shown in the graph of FIG. 2.

The temperature range T1 is controlled so that its temperature range may be kept during a predetermined time tp1 (desirably 5 to 30 sec inclusive). Patterns 1, 2 and 3 as shown in FIG. 2 for example can be usually adopted as a heating pattern until the temperature gets above the temperature range T1.

In order to promote the discharge of SiO gas from the heat treatment space, the chamber is controlled to have a pressure of 1 kPa or less in the temperature range T1.

The reason why the temperature range T1 should be 900 to 1100° C. inclusive is that when the temperature range T1 is over 1100° C., a natural oxide film on the wafer surface can be removed, but there occurs a phenomenon where SiO gas etches the silicon surface as soon as it is generated because the retention temperature is too high. When the temperature range T1 is below 900° C., the wafer is not heated enough to decompose its natural oxide film, and as a result, the natural oxide film on the wafer surface cannot be sufficiently removed.

The reason why the retention time tp1 at the temperature range T1 should be 5 to 30 sec inclusive is that a retention time tp1 of 5 sec or more is enough to give sufficient effect to the natural oxide film, even though the thickness of each natural oxide film may be individually different. And when the retention temperature tp1 is 30 sec or less, the probability of particle adhesion to the surface of the wafer W can be reduced.

The rotational speed of the wafer at the temperature range T1 should be adjusted to 80 to 120 rpm inclusive.

Considering that SiO gas may not be sufficiently discharged when the introduction amount of an inert gas is not enough, the inert gas should be supplied so that an atmosphere inside the chamber can be replaced with it at a rate of 90% or more per minute, that is to say, 30 to 100 L/min inclusive.

By doing so, SiO gas produced in melting the natural oxide film on the surface of the wafer W can be efficiently discharged.

When the gas replacement rate is 90%, the chamber pressure should be reduced, to be specific, 10 kPa or less. Especially, when the chamber pressure is 1 kPa or less, the gas replacement rate becomes 90% within 5 sec, so that the object of the present invention can be accomplished more effectively.

When the rotational speed of the wafer W is less than 80 rpm, the in-plane temperature of the wafer W is uneven, which causes such trouble that the wafer W warps and comes off the susceptor 40a during the treatment.

When the rotational speed of the wafer W is more than 120 rpm, the efficiency of discharging SiO gas is lowered. Consequently, SiO gas tends to stay directly above and below the wafer, which may cause another trouble, that is, the accumulation of reaction products in the treatment chamber, because SiO gas etches the silicon surface instantly at a high temperature over 1100° C.

After the predetermined time tp1 passes and when the temperature in the chamber 20 exceeds the temperature range T1, the temperature further rises rapidly at the predetermined heating rate to T2, desirably to 1300° C., and then held for 30 sec, for instance.

Subsequently, after the chamber is cooled down to T3, e.g., 600° C. at the predetermined cooling rate, the inside is replaced with an oxidizing atmosphere.

After the replacement with an oxidizing atmosphere, the chamber is heated at the predetermined heating rate to T4, e.g., 1250° C., held for 30 sec, and cooled down at the predetermined cooling rate to T5, e.g., 600° C., which brings the RTP to a close.

According to the embodiment of the present invention as described above, when the silicon wafer is heat-treated in an inert gas atmosphere, SiO gas produced in melting the natural oxide film on the wafer surface can be efficiently discharged by adjusting the rotational speed of the wafer and the gas replacement rate in the chamber. As a result, the accumulation of reaction products in the chamber is reduced, which leads to prevention of slip deterioration.

Argon gas is used as the inert gas in the foregoing embodiment, but the method of the present invention also works even if the other inert gases are introduced to the chamber.

EXAMPLES

The method for heat-treating the silicon wafer of the present invention is described further with reference to Examples. In the Examples, the following experiments were carried out in accordance with the foregoing embodiment.

In the Examples, a sheet-type RTP device was used with wafers kept horizontally in the chamber. The wafers were heated by a heat lamp from the front sides and the temperature was monitored with a radiation thermometer from the reverse sides. In the RTO device, 1000 to 1500 sheets of double-sided polished single-crystal silicon wafers with diameters of 300 mm were heat-treated and change of the oxide film thicknesses and that of the slip lengths of the treated wafers were evaluated. The slip length was measured by X-ray topography.

The common heat treatment conditions were as follows: the chamber filled with an argon atmosphere was rapidly heated to 1300° C., kept for 300 sec and then cooled down to 600° C. After replaced with an oxidizing atmosphere without taking the wafers out of the chamber, the chamber was rapidly heated to 1250° C. and kept for 30 sec.

After that, the conditions inside the chamber were set for each of Examples and Comparative Examples as described below. The temperature range T1 (° C.) in conditions below is a temperature range in timing corresponding to the temperature range T1 in the graph of FIG. 2.

(a) the temperature range T1 (° C.)
(b) the rotational speed (rpm) of the wafer in the temperature range T1
(c) the retention time and heating time (sec) in the temperature range T1
(d) the gas replacement rate in the temperature range T1(%)
(e) the pressure (kPa) in the temperature range T1

As shown in Tables 1 and 2, Examples 1 to 13 and Comparative Examples 1 to 6 were set and evaluated according to the foregoing conditions (a) to (e).

In a judgement column of Table 1, A or "excellent" indicates that no thickening of oxide film was not seen throughout the consecutive treatment, and that no noticeable accumulation of $SiO_x$ reaction products was found in the chamber. B or "good" indicates that there occurred such trouble that the wafer came off the susceptor during the heat treatment, though no noticeable accumulation of $SiO_x$ reaction products was found in the chamber. C or "poor" indicates that more oxide film thickening and more slip generation were observed, as the number of wafers for the treatment increased.

Table 2 shows how the pressure (kPa) inside the chamber affected the time until the gas replacement rate reached 90% or more.

TABLE 1

|  | (a)Temperature (° C.) | (b) Rotational Speed (rpm) | (c) Retention Time (sec) | (d) Gas Replacement Rate (%) | Judgement |
|---|---|---|---|---|---|
| Ex. 1 | 900-1100 | 120 | 15 | ≥90 | A |
| Ex. 2 | 900 | 100 | 15 | ≥90 | A |
| Ex. 3 | 1000 | 100 | 15 | ≥90 | A |
| Ex. 4 | 1100 | 100 | 15 | ≥90 | A |
| Ex. 5 | 900-1100 | 80 | 15 | ≥90 | A |
| Ex. 6 | 900-1100 | 50 | 15 | ≥90 | B |

TABLE 1-continued

|  | (a)Temperature (° C.) | (b) Rotational Speed (rpm) | (c) Retention Time (sec) | (d) Gas Replacement Rate (%) | Judgement |
|---|---|---|---|---|---|
| Ex. 7 | 900-1100 | 0 | 15 | ≥90 | B |
| Ex. 8 | 900-1100 | 120 | 5 | ≥90 | A |
| Ex. 9 | 900-1100 | 120 | 30 | ≥90 | A |
| Ex. 10 | 900-1100 | 120 | 45 | ≥90 | B |
| Comp. Ex. 1 | 900-1100 | 150 | 15 | ≥90 | C |
| Comp. Ex. 2 | 900-1100 | 240 | 15 | ≥90 | C |
| Comp. Ex. 3 | 850 | 100 | 15 | ≥90 | C |
| Comp. Ex. 4 | 1150 | 100 | 15 | ≥90 | C |
| Comp. Ex. 5 | 900-1100 | 100 | 2 | ≥90 | C |
| Comp. Ex. 6 | 900-1100 | 100 | 15 | 85 | C |

TABLE 2

|  | (a) Temperature (° C.) | (b) Rotational Speed (rpm) | (e) Pressure (kPa) | The time until the gas replacement rate reaches 90% or more (sec) |
|---|---|---|---|---|
| Ex. 11 | 900-1100 | 120 | 0.1 | 4 |
| Ex. 8 | 900-1100 | 100 | 1 | 5 |
| Ex. 12 | 900-1100 | 100 | 10 | 8 |
| Ex. 13 | 900-1100 | 100 | 100 | 11 |

As shown in Example 10 of Table 1, as the retention time in the temperature range T1 increased, being 45 sec, the probability of particles adhesion to the wafer surface became higher, and SiO reaction products were observed to accumulate inside the chamber, though not conspicuously (judgement B). The result confirmed the desirable retention time in the temperature range T1 is 30 sec or less.

As shown in Comparative Example 4 of Table 1, a natural oxide film on the wafer surface can be removed when the retention temperature is high, or 1150° C., while there occurred a phenomenon where SiO gas etches the silicon surface as soon as it is generated, because of too high retention temperature (judgement C). The result confirmed the desirable retention temperature is 1100° C. or less.

As shown in Comparative Example 3 of Table 1, a natural oxide film could not be sufficiently removed when the retention temperature was low, or 850° C. (judgement C). It was presumably because the temperature was not raised enough to melt a natural oxide film on the wafer surface. The result confirmed the desirable retention temperature is 900° C. or more.

In light of the above results, as confirmed by Table 1, preferable is an embodiment in which the rotational speed of the wafer W is 0 to 120 rpm inclusive and preferably 80 to 120 rpm inclusive, its retention time is 5 to 30 sec inclusive, and the gas replacement rate is 90% or more when the temperature inside the chamber is 900 to 1100° C. inclusive.

As shown in Table 2, when the gas replacement rate is 90%, the gas replacement rate can reach 90% within 5 sec by setting the chamber pressure to 1 kPa or less, which confirms that the object of the present invention can be more effectively accomplished.

Figure 3:
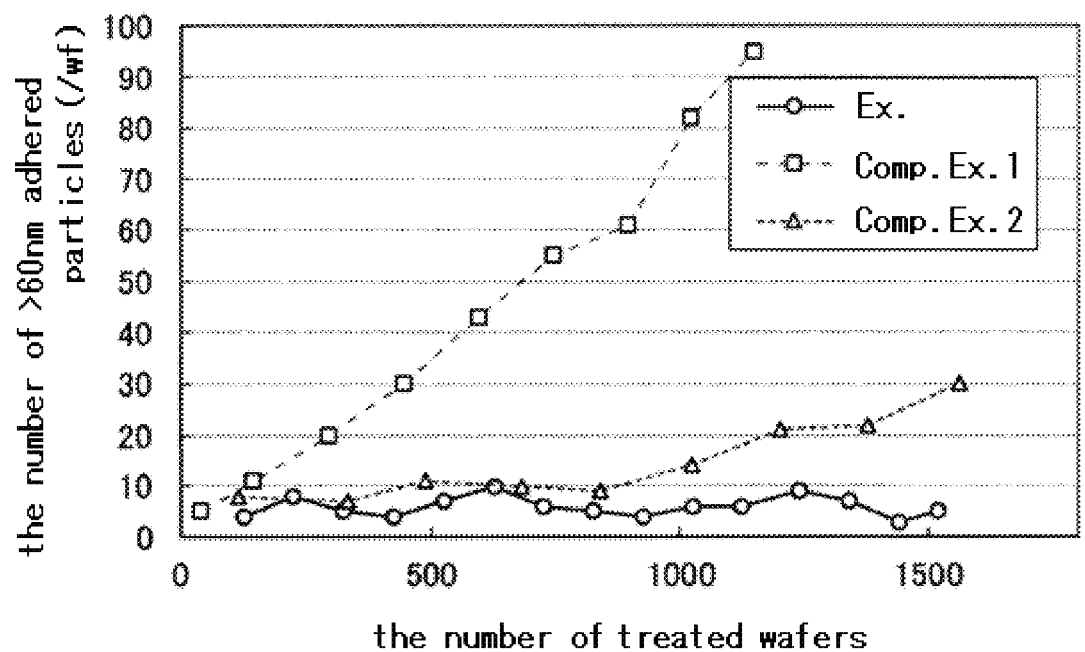
FIG. 3 is a graph showing the result of Examples of the present invention.

As for Example 1, and Comparative Examples 1 and 2 shown in Table 1, the number of adhered particles larger than 60 nm to that of treated wafers (per wafer) is graphed in FIG. 3. The changes of the total slip length (mm) and the rate of increasing oxide film thickness are also shown in graphs of FIGS. 4 and 5, respectively.

In the graph of FIG. 3, the horizontal axis shows the number of treated wafers and the vertical axis shows the number of adhered particles (per wafer). As shown in the graph, as the number of treated wafers increased, the number of adhered particles increased in Comparative Examples 1 and 2, while in Example 1, the number of adhered particles was few without regard to the number of treated wafers.

Figure 4:
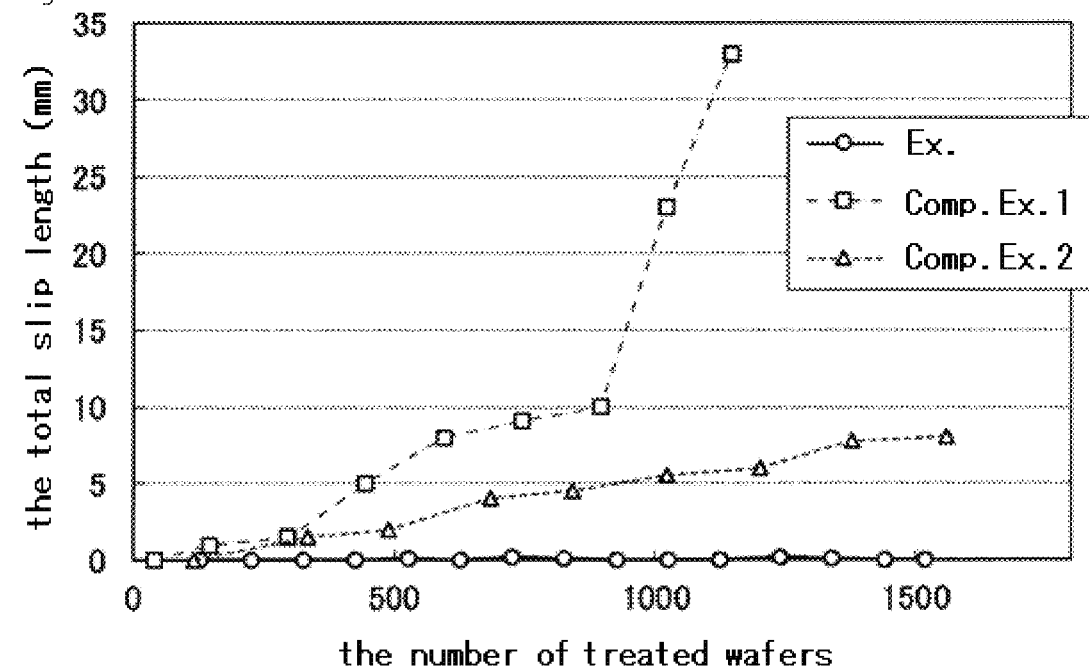
FIG. 4 is another graph showing the result of Examples of the present invention.

In the graph of FIG. 4, the horizontal axis shows the number of treated wafers and the vertical axis shows the total slip length (mm). As shown in the graph, slipping appeared noticeably in Comparative Examples 1 and 2, while no slipping appeared in Example 1.

Figure 5:
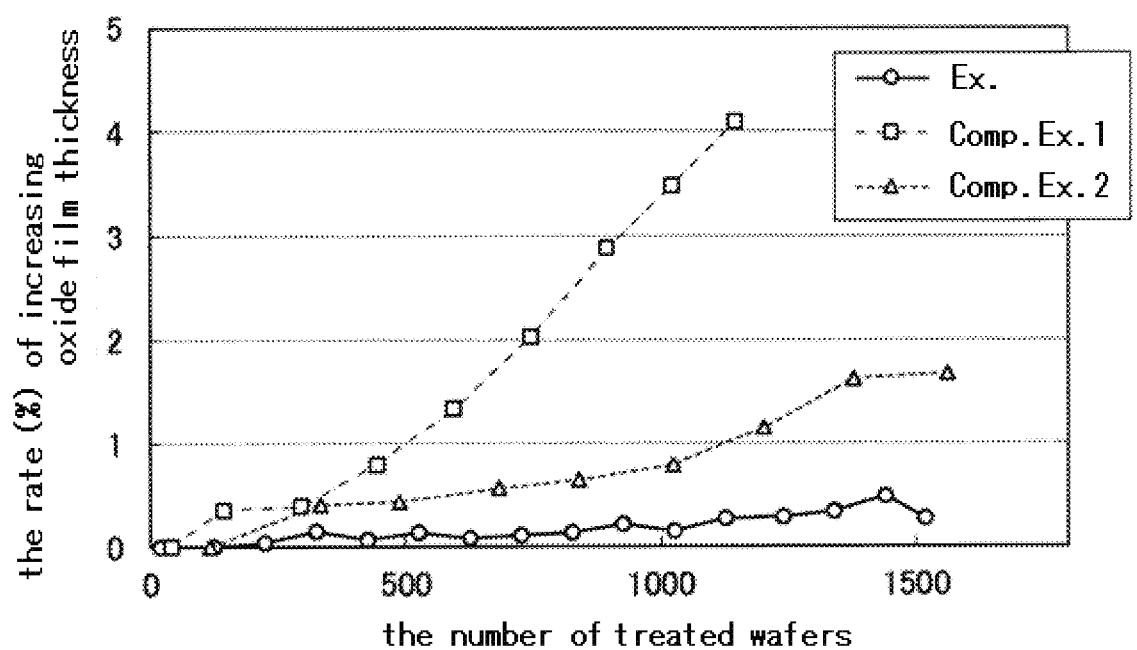
FIG. 5 is the other graph showing the result of Examples of the present invention.

In the graph of FIG. 5, the horizontal axis shows the number of treated wafers and the vertical axis shows the rate (%) of increasing oxide film thickness. As shown in the graph, as the number of treated wafers increased, the oxide film thickness increased in Comparative Examples 1 and 2, while in Example 1, the rate of increase in oxide film thickness was suppressed low.

As explained above, to be sure, the present invention allows the SiO gas produced in melting a natural oxide film on the surface of the silicon wafer to discharge efficiently and the reaction product accumulation inside the heat treatment chamber to be suppressed, which can thereby prevent slip deterioration.

REFERENCE SIGNS LIST

10 RTP device
20 chamber
20a atmospheric gas inlet
20b atmospheric gas outlet
25 reaction space
30 lamp
40 wafer supporting section

The invention claimed is:
1. A method for heat-treating a silicon wafer, wherein a natural oxide film is on a surface of the silicon wafer, in which the silicon wafer having the natural oxide film is installed rotatably in a chamber and is subjected to a thermal process of heating and cooling in an inert gas atmosphere to reduce crystal defects existing in the silicon wafer, wherein the method comprises:

placing the silicon wafer having the natural oxide film in the chamber kept at a requested temperature and introducing the inert gas to make the chamber have an inert gas atmosphere;

heating the chamber until a temperature of the chamber reaches a first temperature in a range of 900° C. to less than 1100° C. at which the natural oxide film melts, setting the temperature of the chamber to the first temperature at which the natural oxide film melts, holding the wafer for a period of 5 seconds or more to less than 30 seconds at the first temperature of the chamber during which period a rotational speed of the wafer is set to 80 to 120 rpm inclusive and the temperature of the chamber is set to the first temperature, and controlling an inert gas supply in the chamber to be 30 to 100 L/min inclusive so as to replace an atmosphere inside the chamber with the inert gas at a gas replacement rate of 90% or more per minute at the first temperature, and discharging the SiO gas produced in melting the natural oxide film on the surface of the silicon wafer;

after the holding period of 5 seconds or more to less than 30 seconds, raising the chamber temperature to a second temperature being a maximum temperature reached that is above the first temperature, after raising the chamber temperature to the second temperature, cooling the chamber temperature to a third temperature, and carrying out a heat treatment at a fourth temperature which is lower than the second temperature, wherein the heat treatment is carried out after replacing the atmosphere in the chamber with an oxidizing atmosphere.

2. The method for heat-treating a silicon wafer according to claim 1, wherein the pressure inside the chamber is 1 kPa or less during the period of 5 seconds or more to less than 30 seconds at which the chamber temperature is set to the first temperature in the range of 900° C. or more to less than 1100° C.

3. The method according to claim 1, wherein the second temperature is 1300° C.

4. The method according to claim 1, wherein the third temperature is 600° C.

* * * * *